United States Patent [19]
Ichikawa et al.

[11] Patent Number: 5,714,408
[45] Date of Patent: Feb. 3, 1998

[54] METHOD OF FORMING SILICON NITRIDE WITH VARIED HYDROGEN CONCENTRATION

[75] Inventors: Yuji Ichikawa, Okazaki; Yasushi Tanaka, Kariya; Yasuo Souki, Toyota; Ryouichi Kubokoya; Akira Kuroyanagi, both of Okazaki; Hirohito Shioya, Chiryu, all of Japan

[73] Assignee: Denso Corporation, Kariya, Japan

[21] Appl. No.: 766,619

[22] Filed: Dec. 13, 1996

[30] Foreign Application Priority Data

Dec. 14, 1995 [JP] Japan ................... 7-325727

[51] Int. Cl.⁶ .................................... H01L 21/318
[52] U.S. Cl. .................... 437/241; 148/DIG. 114
[58] Field of Search ............ 437/241; 148/DIG. 114

[56] References Cited

U.S. PATENT DOCUMENTS 4,962,065  10/1990  Brown et al. ................ 437/242

FOREIGN PATENT DOCUMENTS

| 61-154171 | 7/1986 | Japan . |
| 62-114232 | 5/1987 | Japan . |
| 62-174927 | 7/1987 | Japan . |
| 1-304735 | 12/1989 | Japan . |
| 2-15630 | 1/1990 | Japan . |
| 2-103936 | 4/1990 | Japan . |
| 6-232113 | 8/1994 | Japan . |

OTHER PUBLICATIONS

Tatsuuma et al: "Hot Carrier Effects", Influence of Mechanical Stress, The Technical Studies Reports at the Electronic Data Communication Learned Society 90–123, P33–P38.

Okuyama et al: "Measuremenet and analysis of hot carrier degradation of sub micron mosfet devices", (SDM87–155) Hitachi Musashi Works, Hitachi VLSI Engineering, P19–P24.

Yasuada: "Plasma CVD Technilogy and Its Applications", (Applied Physics, vol. 50, 6th Issue (1981), P638–P649.

Rosler: "Development of Plasma CVD Devices in Market", Solid State Technology, Aug. 1991 Issue, P28–P34.

Sun et al: "Effects of Silicon Nitride Encapsulation of MOS Device Stability", IEEE 1980 pp. 244–251.

Flamm et al: "A New Chemistry for Low Hydrogen PECVD Silicon Nitride", Technology Topies, Mar. 1987 Issue, P43–P44.

Chang et al:, "Low Stress, Low Hydrogen Nitride Deposition", Solid State Technology, Technology Topics May 1988 Issue, P193–P195.

Primary Examiner—Charles L. Bowers, Jr.
Assistant Examiner—Matthew Whipple
Attorney, Agent, or Firm—Cushman, Darby & Cushman IP Group of Pillsbury, Madison & Sutro LLP

[57] ABSTRACT

On TEOS (tetraethyl ortho silicate) film and a surface of an aluminum wiring formed on a P-type silicon substrate, there is formed a low hydrogen content plasma SiN film on which a high hydrogen content plasma SiN film is laminated. The low hydrogen content plasma SiN film is lower in content of hydrogen than the high hydrogen content plasma SiN film. Accordingly, even when hydrogen is about to go toward and into the P-type silicon substrate side from the high hydrogen content plasma SiN film, the entry of hydrogen is blocked by the low hydrogen content plasma SiN film in which amount of Si-H bonds is reduced.

11 Claims, 17 Drawing Sheets

METHOD OF FORMING SILICON NITRIDE WITH VARIED HYDROGEN CONCENTRATION

CROSS REFERENCE TO RELATED APPLICATION

This application is based upon and claims the benefit of priority of the prior Japanese Patent Application No. Hei 7-325727 filed on Dec. 14, 1995, the contents of which are incorporated herein by reference.

BACKGROUND OF THE INVENTION

1. Field of the Invention

The present invention relates to an IC (Integrated Circuit) including a transistor having a gate insulation film.

2. Description of the Related Art

A silicon nitride film (SiN film) has been widely used as a passivation film or interlayer insulation film of an IC.

In a transistor having a gate insulation film, an interfacial level of a gate insulation film is shifted if hot carriers enters the gate insulating film. As a result, hot carrier deterioration that the gate insulating film fails to function properly may occur.

When a plasma SiN film is used as, for example, a passivation film in a transistor having a gate insulation film, the hydrogen contained therein also enters the gate insulation film and promotes the hot carrier deterioration (The Technical Studies Reports At The Electronic Data Communication Learned Society 90–123, p 33, "Hot Carrier Effects" by Kenichiro TATSUUMA and others). When the amount of hydrogen in a passivation film is decreased as a countermeasure against the above-described problem, a film stress of the passivation film increases. As a result, there arises the problem that the generation of Al (aluminum) voids and the like follows. Here, the aluminum is used as wiring in a transistor. Also, when it is attempted to achieve the decrease in the film stress by reducing a flow rate of gas to form a passivation film and thereby lowering the density thereof, the coverability of the passivation film deteriorates particularly at a stepped portion. In addition, the amount of hydrogen contained in the passivation film is likely to increase. As a result, there may arise problems with respect to the moisture resistance of the passivation film as well as the hot carrier deterioration. In this way, it is impossible to achieve the enhancement of a hot carrier life while satisfying sufficiently the moisture resistance, low film stress, uniformity of the film thickness which becomes important in manufacture, and producibility as originally designed which are needed as a protective film. Further, if a semiconductor device is a memory device such as an EPROM, UV transmission characteristic and charge retention characteristic of a floating gate become important factors to the protective film.

For the above-mentioned reasons, it has been demanded to provide a semiconductor device which can excellently enhance the hot carrier life while ensuring the UV transmission characteristic and charge retention characteristic as well as the moisture resistance (enhanced stepped portion coverage) and decreased film stress without changing a basic film thickness. Further, when such a semiconductor device is realized, a change in the film forming conditions made with respect to the conventional manufacturing method should avoid resulting in a decrease in a throughput and an increase in a manufacturing cost.

SUMMARY OF THE INVENTION

In view of the above, an object of the present invention is to provide a semiconductor device which excellently maintains its performance through a novel construction and which is easy to manufacture.

In a plasma SiN film there exists hydrogen (which has been dissociated mainly from weakly bonded Si-H). It is said that in the case of a short channel MOS device this hydrogen enters the MOS device to cause deterioration of a gate oxide film. On this account, in the present invention, conceiving on the Si-H bonds of the hydrogen that is contained in the plasma SiN film when this film is formed, a first plasma SiN film having Si-H bond in a reduced amount and a second plasma SiN film having Si-H bond in a larger amount than the first plasma SiN film are laminated.

Accordingly, although hydrogen is about to enter the short channel MOS device side from the second plasma SiN film, this entry of hydrogen is blocked (or the hydrogen is trapped) by the first plasma SiN film having Si-H bond in the reduced amount (The reason is presumed to be that the hydrogen from inside the second plasma SiN film is combined with the dangling bonds of silicon in the first plasma SiN film having Si-N bond in the reduced amount and is thereby stopped from going into the short channel MOS device.). This prevents bad effects to the short channel MOS device (more specifically, prevents the gate oxide film from being deteriorated). As a result, this structure is excellent in increasing the life of the hot carrier.

Also, a plasma SiN film of a multi-layer structure as described above can be formed easily by the following method. First, ammonium gas and silane family gas are supplied while increasing the flowrate of at least one of them to thereby form a low hydrogen content plasma SiN film (first plasma SiN film). Thereafter, each of the both gases is supplied at a fixed flowrate to thereby form on the low hydrogen content plasma SiN film a plasma SiN film (second plasma SiN film) that is higher in content of hydrogen than the low hydrogen content plasma SiN film.

If, before causing the silane family gas to flow, a power source voltage is applied in a state where nitrogen gas is being caused to flow, to thereby execute surface roughening processing by means of plasma on the surface of an underlying layer on which the low hydrogen content plasma SiN film is deposited and thereafter the low hydrogen content plasma SiN film starts to be formed thereon, the low hydrogen content plasma SiN film can be firmly adhered thereonto.

Further, if, when forming the low hydrogen content plasma SiN film a low hydrogen content plasma SiN film is mainly formed from nitrogen gas and silane family gas, it is possible to strengthen the Si-N bond in the low hydrogen content plasma SiN film. Further, if, after the formation of the low hydrogen content plasma SiN film an amount of nitrogen gas to be supplied is decreased and, on the other hand, an amount of ammonium gas to be supplied is increased to thereby form a high hydrogen content plasma SiN film mainly from ammonium gas and silane family gas, it is possible to achieve a decrease in a film stress and an enhancement of an in-plane uniformity with respect to the high hydrogen content plasma SiN film.

BRIEF DESCRIPTION OF THE ACCOMPANYING DRAWINGS:

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS (First Embodiment)

A first embodiment of the present invention will now be explained with reference to the drawings.

Figure 1:
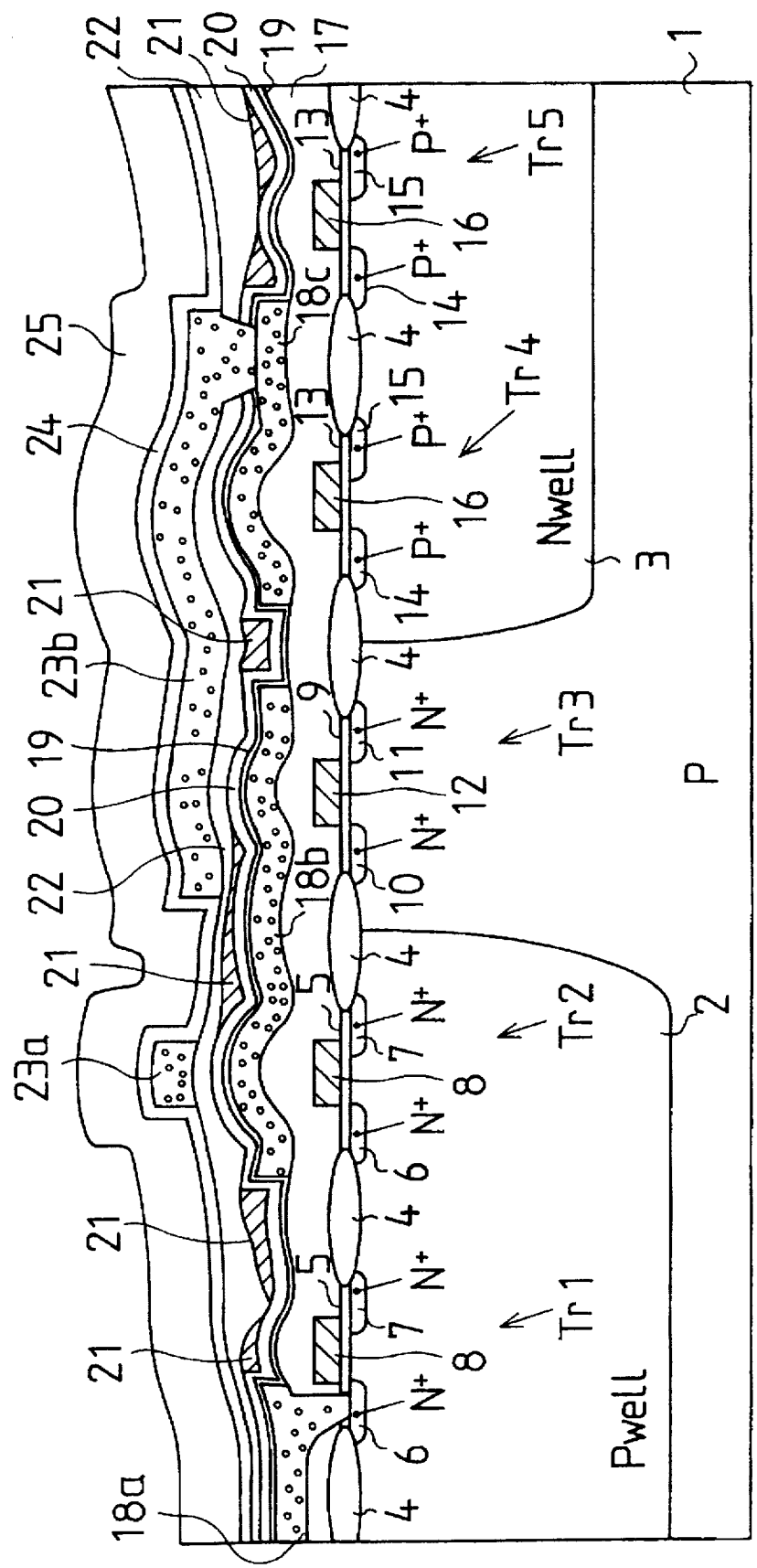
FIG. 1 is a vertical sectional view illustrating a semiconductor device according to a first embodiment of the present invention.

FIG. 1 is a vertical sectional view illustrating a semiconductor device according to the first embodiment. This device is embodied as an IC (Integrated Circuit) for use in an automobile and includes a MOS transistor.

The use environment (particularly the temperature environment) for an automobile IC is severe. Accordingly, the demanded performance is that, when performing an inverter operation at a frequency of 20 MHz, with an applied voltage Vd of −5.5 V and in a duty ratio of 50%, the point in time at which the operating speed of the MOS transistor decreases by 10% satisfies the value of 1.7 years that is estimated when DC stress voltage Vd=5.5 V under the assumption that the guarantee period of the automobile be 19 years (so as for the automobile IC to resist the intermittent use thereof during a 19-year period).

It is to be noted that the construction of this semiconductor device may be used for EPROM OR EEPROM (including a flash memory).

A P-type silicon substrate 1 serves as a semiconductor substrate. P well region 2 and N well region 3 are formed in P-type silicon substrate 1. In a surface portion of P well region 2 in P-type silicon substrate 1, an N-channel MOS transistor Tr1 and an N-channel MOS transistor Tr2 are formed. Also, in a surface portion of P-type silicon substrate 1, an N-channel MOS transistor Tr3 is formed. Further, in a surface portion of N well region 3 in P-type silicon substrate 1, a P-channel MOS transistor Tr4 and a P-channel MOS transistor Tr5 are formed.

Explaining a detailed construction of MOS transistors Tr1 to Tr5, field oxide films (LOCOS oxide films) 4 are formed on the surface portion of P-type silicon substrate 1. In the region where N-channel MOS transistors Tr1 and Tr2 are formed, the surface portion of P-type silicon substrate 1 forms thereon gate oxide films 5 on which there are formed polysilicon gate electrodes 8. In the portions of P well region 2 that are beneath the polysilicon gate electrodes 8, $N^+$ source regions 6 and $N^+$ drain regions 7 are formed.

In the region where N-channel MOS transistor Tr3 is formed, the surface portion of P-type silicon substrate 1 forms thereon a gate oxide film 9 on which there is formed a polysilicon gate electrode 12. The portion of P-type silicon substrate 1 that is beneath the polysilicon gate electrode 12 forms therein an $N^+$ source region 10 and an $N^+$ drain region 11.

In the region where P-channel MOS transistors Tr4 and Tr5 are formed, the surface portion of P-type silicon substrate 1 forms thereon gate oxide films 13 on which there are formed polysilicon gate electrodes 16. The portions of N well region 3 that are beneath the polysilicon gate electrodes 16 formes therein $P^+$ source regions 14 and $P^+$ drain regions 15. Here, the thickness of each of the gate oxide films 5, 9 and 13 is approximately 200 Å or so.

Over P-type silicon substrate 1 having MOS transistors Tr1 to Tr5, there is formed a BPSG film 17 over which there are formed first layer aluminum wiring 18a, 18b and 18c. The first layer wiring 18a and $N^+$ source region 6 of N channel MOS transistor Tr1 are electrically connected to each other through a contact hole. Over BPSG film 17 and the surfaces of first layer aluminum wiring 18a, 18b and 18c there is formed a plasma SiN film 19 having a thickness of 1000 Å. Over plasma SiN film 19 there is formed a TEOS (tetraethyl ortho silicate) film 20 that serves as a first interlayer insulation film. In specified regions on TEOS film 20 there are formed SOG (Spin On Glass) films 21 to smooth the surface thereof.

Over TEOS film 20 and the surfaces of SOG films 21 there is formed a TEOS film 22 that serves as a second interlayer insulation film. Over TEOS film 22 there are formed second layer aluminum wiring (multi-layer wiring) 23a and 23b. Second layer aluminum wiring 23b and first layer aluminum wiring 18c are electrically connected to each other through a contact hole. By using a multi-layered aluminum wiring (second layer aluminum wiring 23a and 23b and first layer aluminum wiring 18a, 18b and 18c, etc.), a power source voltage and ground voltage are applied to MOS transistors Tr1 to Tr5 that are formed in P-type silicon substrate 1.

Over TEOS film 22 and the surfaces of second layer aluminum wiring 23a and 23b there is formed a low hydrogen content plasma SiN film 24 over which a high hydrogen content plasma SiN film 25 is formed. Low hydrogen content plasma SiN film 24 is lower in content of hydrogen than high hydrogen content plasma SiN film 25. In detail, the amount of Si-H bonds in high hydrogen content plasma SiN film 25 is $8 \times 10^{21}/cm^3$ and, on the other hand, the amount of Si-H bonds in low hydrogen content SiN film 24 is $6 \times 10^{21}/cm^3$ or less. The total thickness of plasma SiN films 24 and 25 is *16000* Å or so. The thickness of low hydrogen content plasma SiN film 24 is *500* Å or so.

Here, high hydrogen content plasma SiN film 25 has a low film stress and thereby high step coverage characteristic (the coverability of the stepped portion). However, high hydrogen content plasma SiN film 25 contains much hydrogen therein. The hydrogen becomes a factor of causing a hot carrier deterioration in MOS transistors Tr1 to Tr5 formed in P-type silicon substrate 1. Low hydrogen content plasma SiN film 24 has the property of inhibiting the passage of hydrogen therethrough.

While hydrogen is about to enter from inside high hydrogen content plasma SiN film 25 used as the passivation film, the use of plasma SiN films 24 and 25 having such a two-layer structure enables hydrogen to be blocked (trapped) by low hydrogen content plasma SiN film 24 that has the reduced amount of Si-H bonds. This phenomenon is presumed to occur because the hydrogen that has gotten out of inside high hydrogen content plasma SiN film 25 is combined with the dangling bonds of silicon in low hydrogen content plasma SiN film 24. As a result, hydrogen is stopped from going into MOS transistors Tr1 to Tr5 side.

Next, the method for manufacturing the above-constructed IC for an automobile will now be explained with reference to FIGS. 2 to 6.

Figure 2:
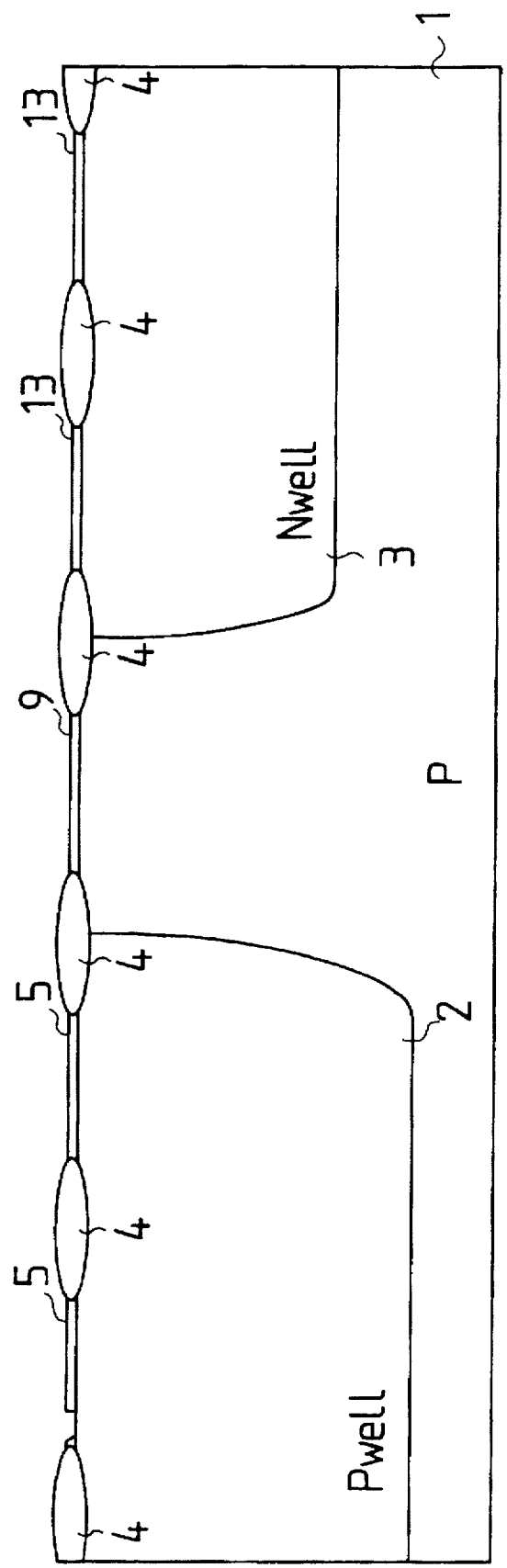
FIG. 2 is a sectional view illustrating a first step of a method for manufacturing the semiconductor device.

As illustrated in FIG. 2, P-type silicon substrate 1 is prepared. Then, P well region 2 and N well region 3 are formed therein. By using a LOCOS oxidation method, at the surface portion of P-type silicon substrate 1 there are formed field oxide films 4 and gate oxide films 5, 9 and 13.

Figure 3:
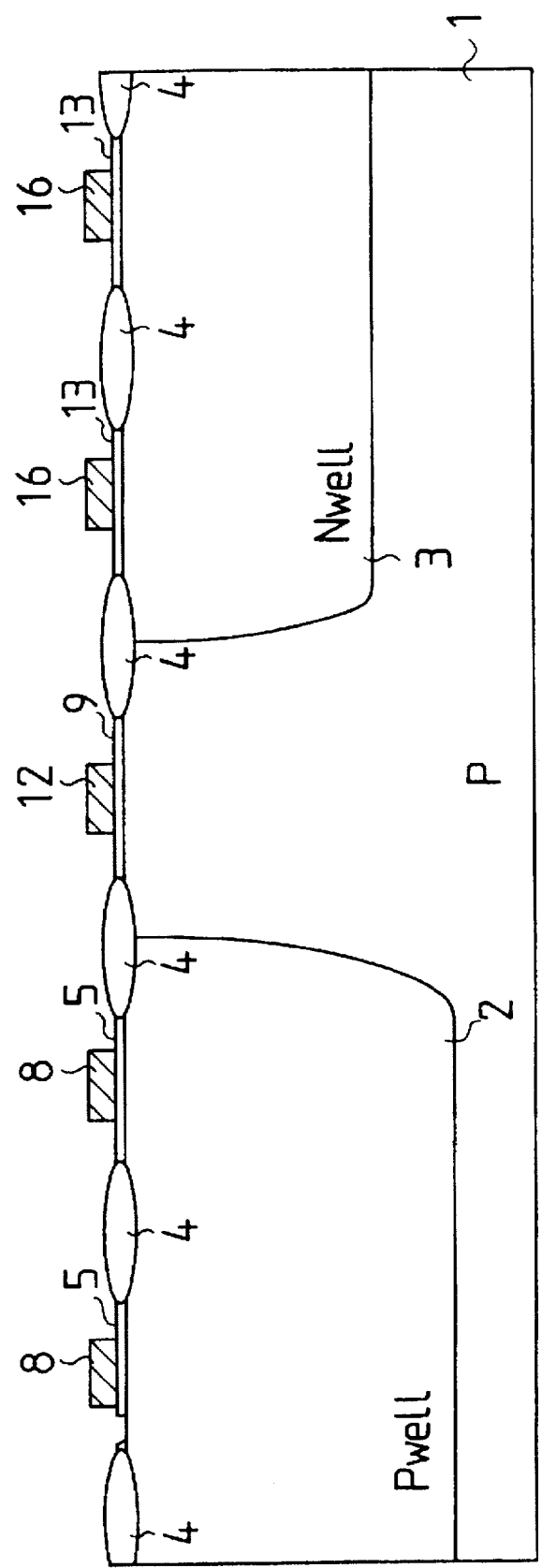
FIG. 3 is a sectional view illustrating a second step of the method for manufacturing the semiconductor device.
Figure 4:
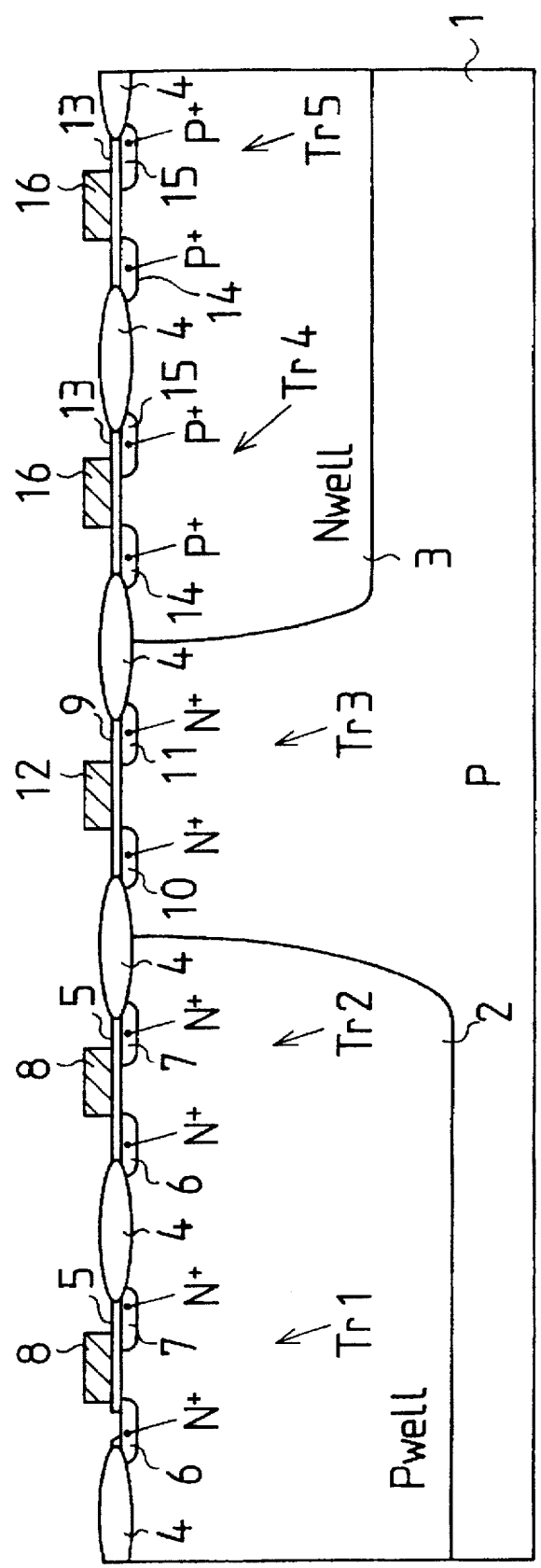
FIG. 4 is a sectional view illustrating a third step of the method for manufacturing the semiconductor device.

Subsequently, as illustrated in FIG. 3, polysilicon gate electrodes 8, 12 and 16 are formed on gate oxide films 5, 9 and 13. Further, as illustrated in FIG. 4, source regions 6, 10 and 14 and drain regions 7, 11 and 15 are formed by an ion implantation method.

Figure 5:
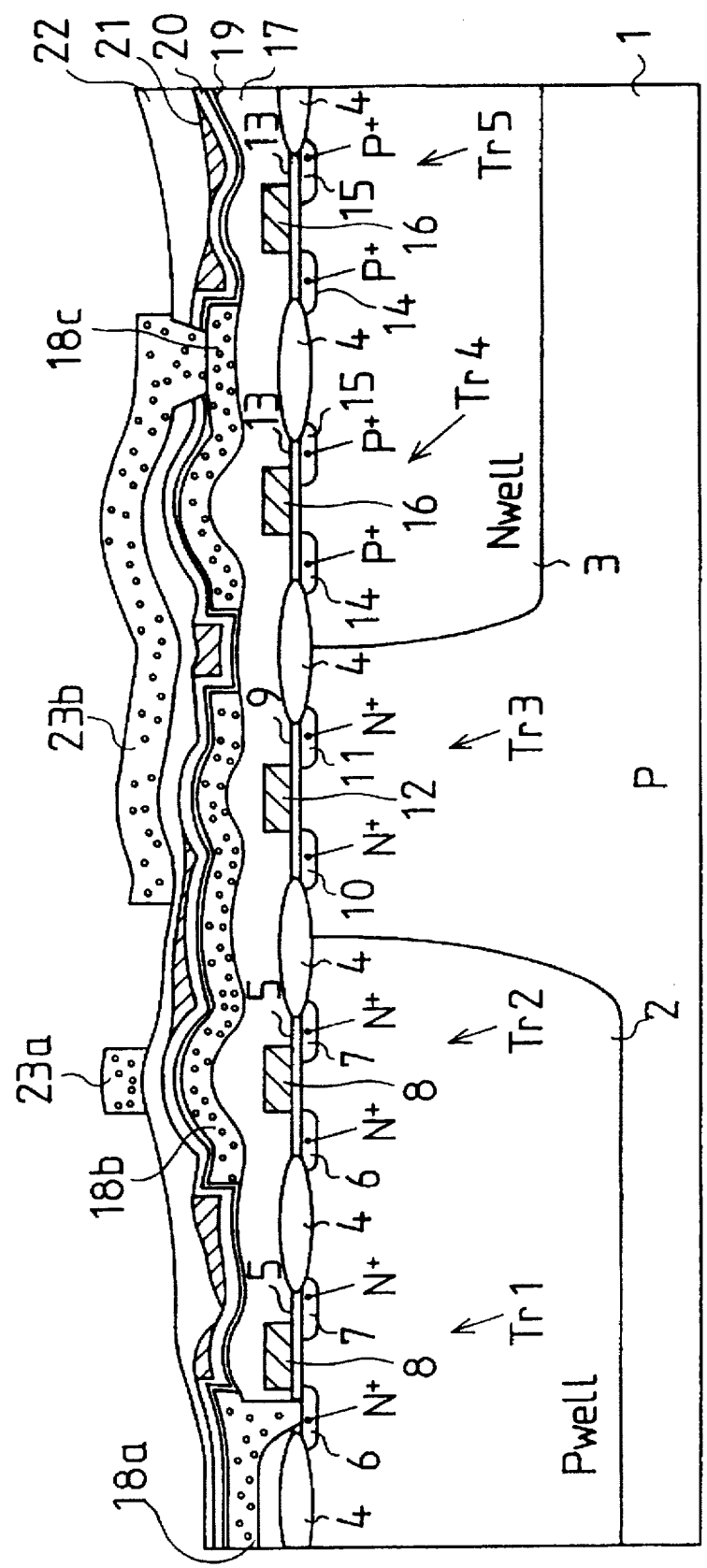
FIG. 5 is a sectional view illustrating a fourth step of the method for manufacturing the semiconductor device.

Then, as illustrated in FIG. 5, over P-type silicon substrate 1 there are deposited sequentially BPSG film 17, first layer aluminum wiring 18a, 18b and 18c, plasma SiN film 19, TEOS film 20, SOG film 21, TEOS film 22 and second layer aluminum wiring 23a and 23b.

Figure 6:
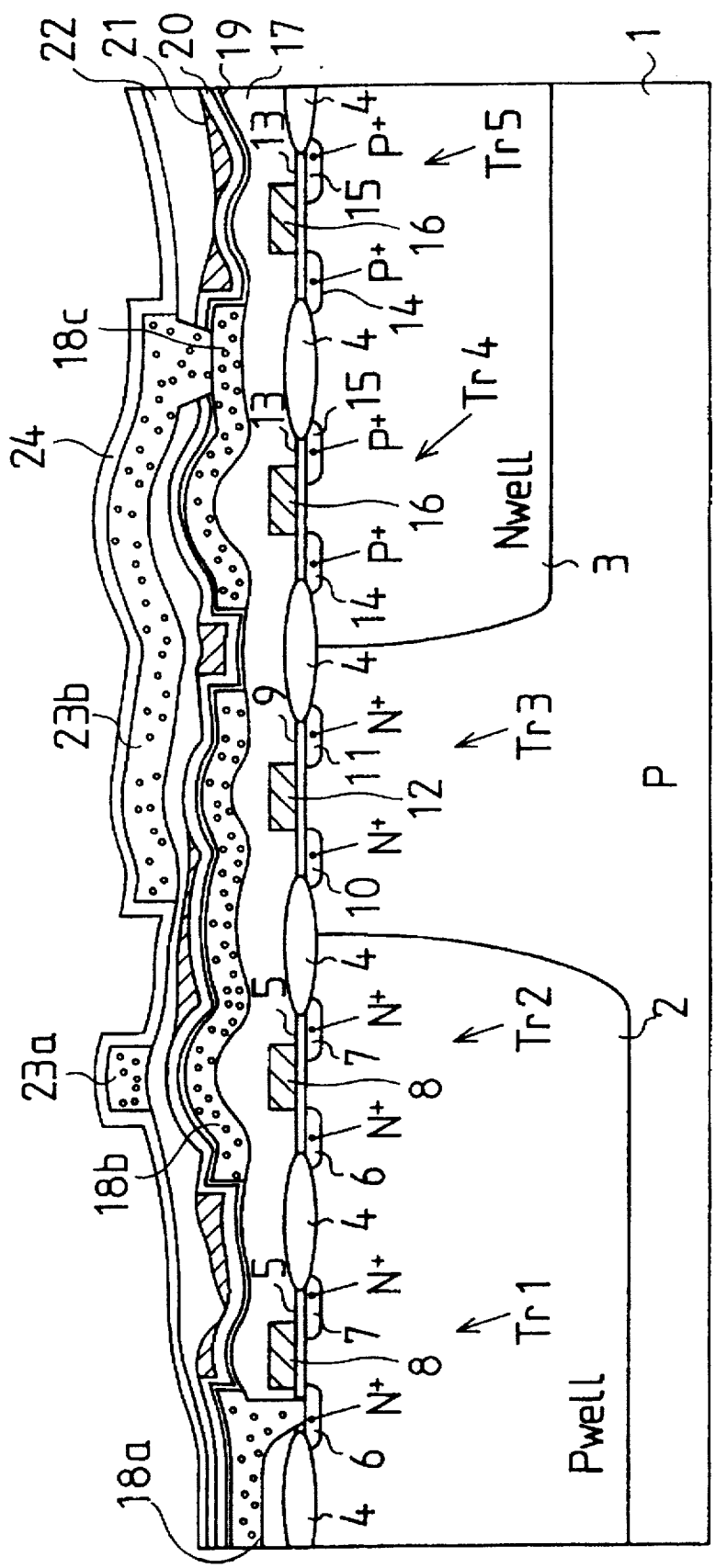
FIG. 6 is a sectional view illustrating a fifth step of the method for manufacturing the semiconductor device.

Thereafter, as illustrated in FIG. 6, low hydrogen content plasma SiN film 24 is formed by the use of a plasma CVD method. As illustrated in FIG. 1, high hydrogen content plasma SiN film 25 is further formed thereover. Thereafter, specified regions of plasma SiN films 24 and 25 are etched and thereby opened to provide aluminum pads.

Here, the method of laminating low hydrogen content plasma SiN film 24 and high hydrogen content plasma SiN film 25 will be explained in detail.

In this embodiment, as a plasma CVD apparatus, there is used the EAGLE-10 made by Nippon A●S●M Co. Ltd. This apparatus is a per-sheet processing plasma CVD apparatus.

Figure 7:
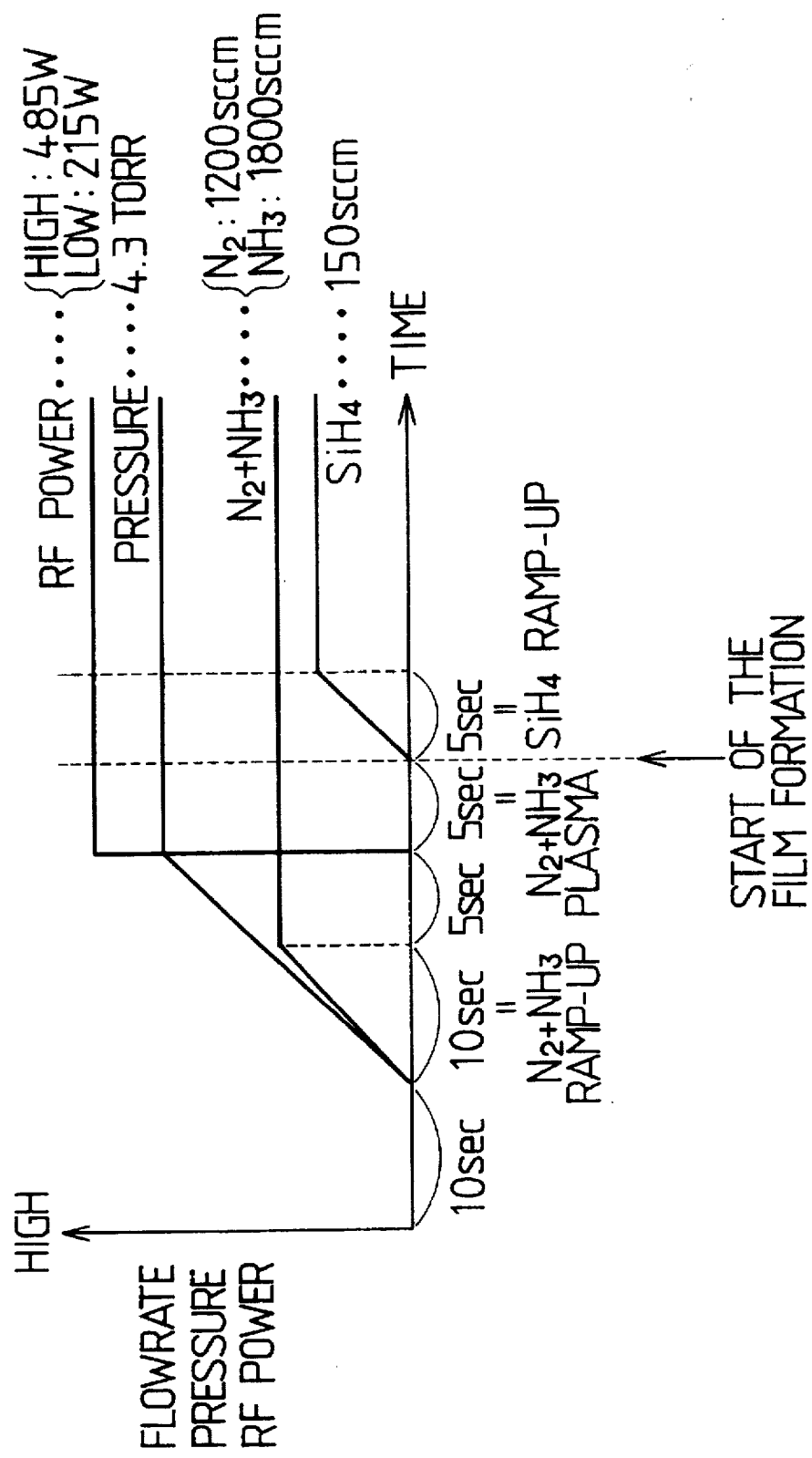
FIG. 7 is a diagram illustrating respective states of the supply of the gas, the pressure and the RF power when the plasma SiN film is made under a plasma CVD method.

In FIG. 7, there are illustrated respective states of the supply of RF power, the change in pressure, the supply of nitrogen gas ($N_2$) and ammonium gas ($NH_3$), and the supply of silane gas ($SiH_4$) when this plasma CVD apparatus is operated.

In FIG. 7, first, the pressure reduction operation and the supply of nitrogen gas ($N_2$) and ammonium gas ($NH_3$) are started simultaneously. A time period of 15 seconds is needed as a pressure reduction time period for obtaining a target degree of vacuum (4.3 Torr). Also, nitrogen gas ($N_2$) and ammonium gas ($NH_3$) can reach respective target flow-rates ($N_2$; 1200 sccm, $NH_3$; 1800 sccm) after 10 seconds. When the target degree of vacuum and the target gas flowrate have been obtained, a high frequency power source voltage (RF power) is applied between a lower electrode and an upper electrode (High 485 W and Low 215 W). When 5 seconds have lapsed after power-on, the supply of silane gas ($SiH_4$) is started. At this time, a film formation is started. The supply of silane gas ($SiH_4$) is linearly increased until 5 seconds have lapsed. During this time period of 5 seconds, low hydrogen content plasma SiN film 24 shown in FIG. 1 is formed. After the flowrate of silane gas ($SiN_4$) has reached a predetermined value (150 sccm), the supply thereof is continued at a fixed flowrate. As a result, there is formed high hydrogen content plasma SiN film 25 of FIG. 1.

Figure 8:
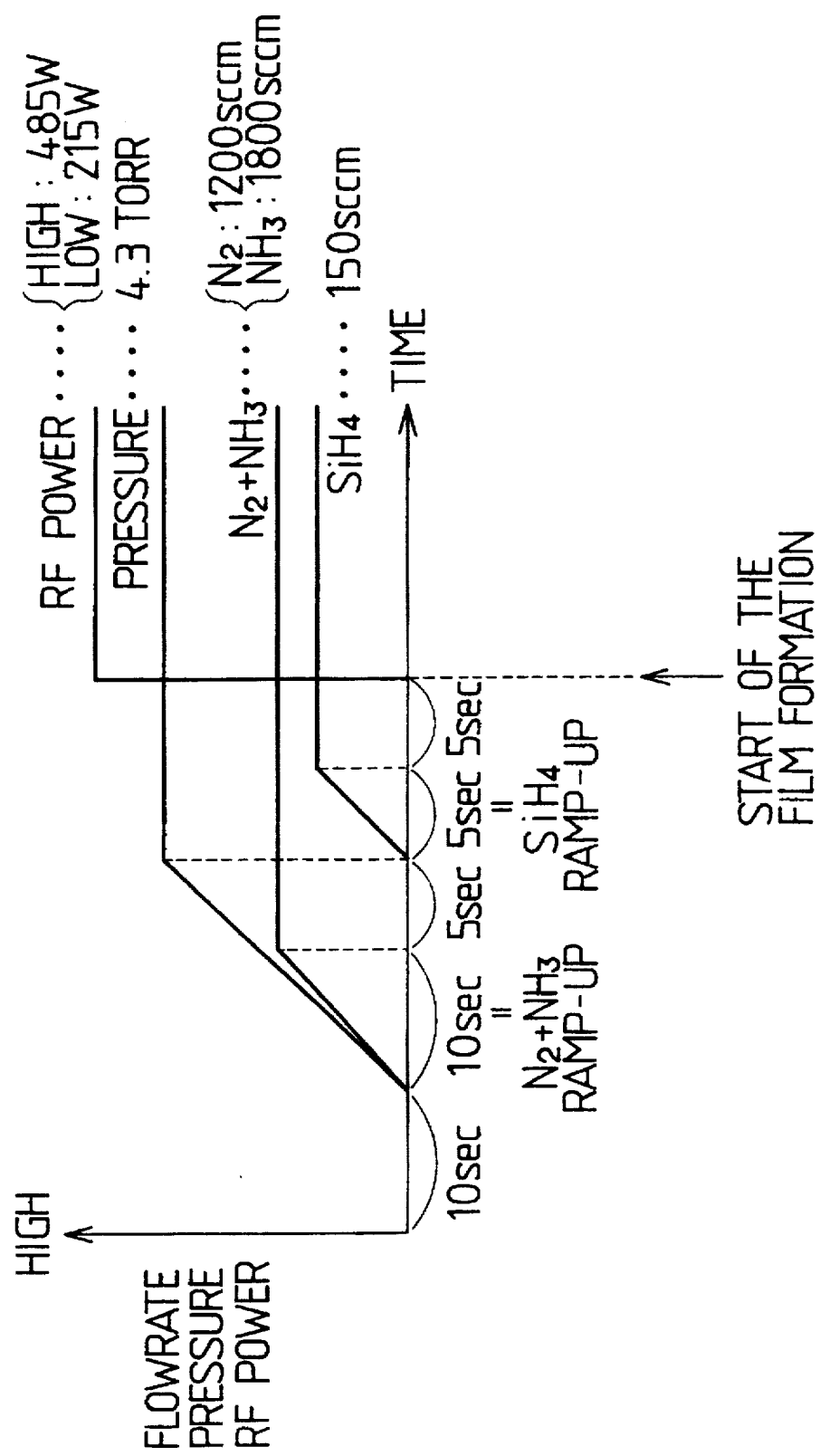
FIG. 8 is a diagram illustrating respective states of the supply of the gas, the pressure and the RF power when the plasma SiN film to be compared is made under the plasma CVD method.

The method according to the first embodiment illustrated in FIG. 7 will now be explained compared to that illustrated in FIG. 8 which is used when forming a general single-layer plasma SiN film. In the formation of the single-layer film as illustrated in FIG. 8, the pressure reduction operation and the supply of nitrogen gas ($N_2$) and ammonium gas ($NH_3$) are started simultaneously. When the target degree of vacuum and the supply of nitrogen gas and ammonium gas at respective fixed flowrates have been attained, the supply of silane gas is started. After the silane gas has been supplied at a fixed flowrate, the RF power is made "on" to thereby start the film formation. The film continues to be deposited until the thickness thereof becomes a predetermined thickness.

As is understood from the comparison between the views of FIGS. 7 and 8, by changing the timing with which the supply of silane gas ramps up, the plasma SiN film that is formed at an initial stage of the film formation and the plasma SiN film that is formed when silane gas is being stably supplied are different from each other in terms of property. That is, in the case illustrated in FIG. 7, the timing of the on-operation of the RF power is set ahead of the timing of the commencement of the supply of silane gas ($SiN_4$). When the silane gas is supplied while increasing the flowrate thereof because pressure has been reduced to 4.3 Torr and discharge can be made by the RF power, it becomes possible to form low hydrogen content plasma SiN film 24.

Figure 9:
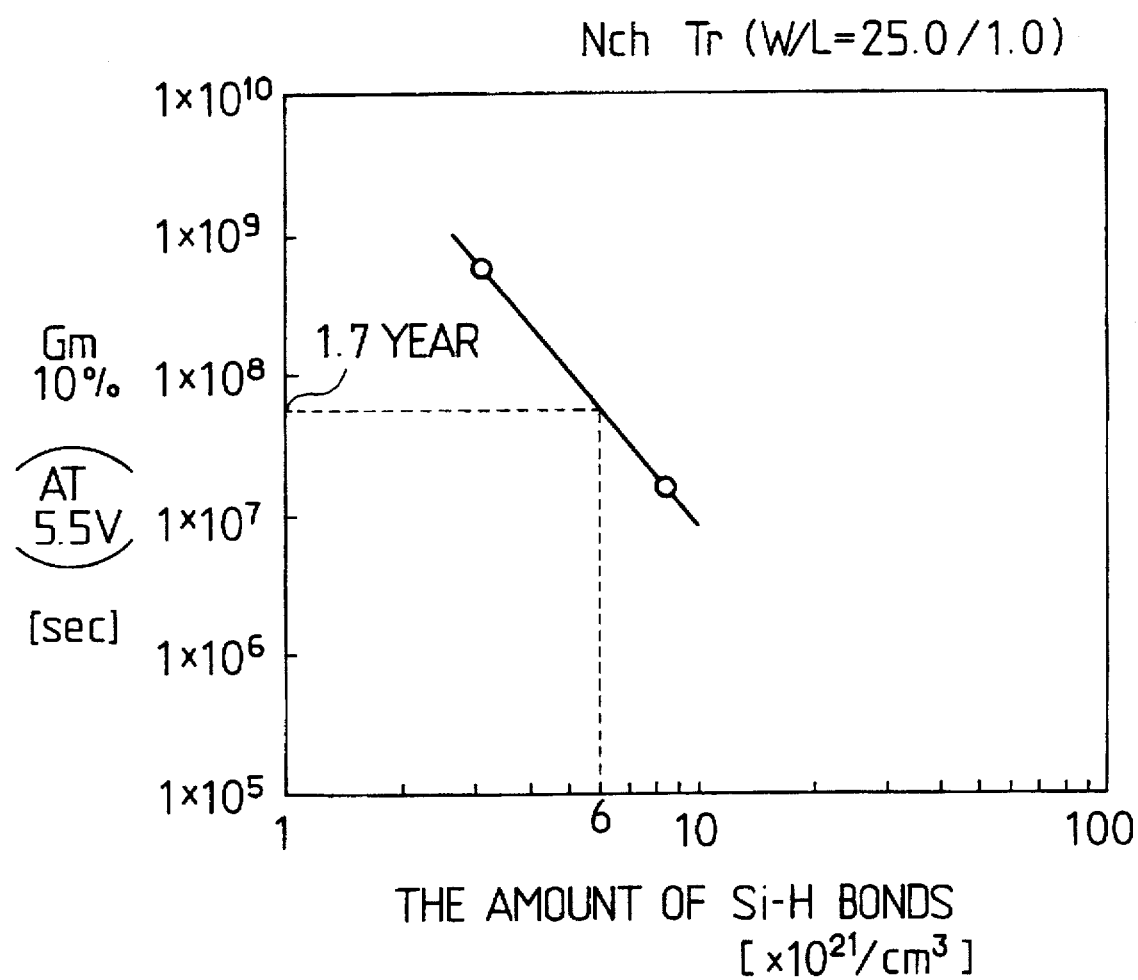
FIG. 9 is a graphic diagram illustrating the life of the device measured with respect to the amount of Si-H bonds in the plasma SiN film.

FIG. 9 illustrates the deterioration period of a MOS transistor measured with respect to the amount of Si-H bonds in the plasma SiN film. In, FIG. 9, the amount of Si-H bonds is plotted on the abscissa axis and the time Gm 10% at which the characteristic of the MOS transistor decreases by 10% is plotted on the ordinate axis. The operating voltage is set at 5.5 bolts. Also, as a sample, there is used an N channel MOS transistor which is set such that W (gate width)/L (gate length)=25.0/1.0.

From the relationship between the Si-H bond amount and the deterioration period of the MOS transistor in FIG. 9, it is understood that it is necessary that in order to resist the continuous use of 1.7 years the Si-H bond amount in a low hydrogen content plasma SiN film be $6 \times 10^{21}/cm^3$ or less.

Figure 10:
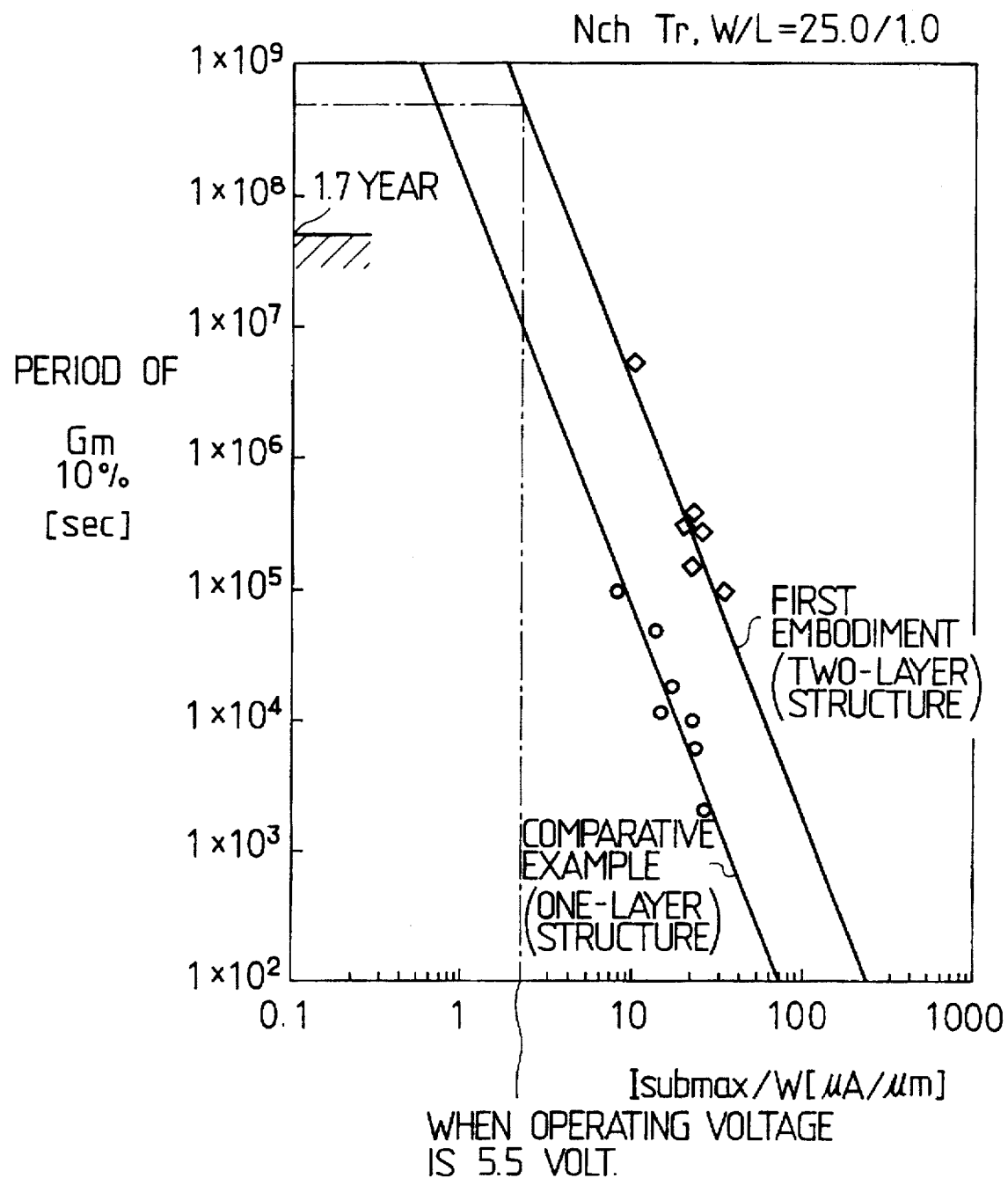
FIG. 10 is a graphic diagram illustrating the period during which a MOS transistor deteriorates.
Figure 11:
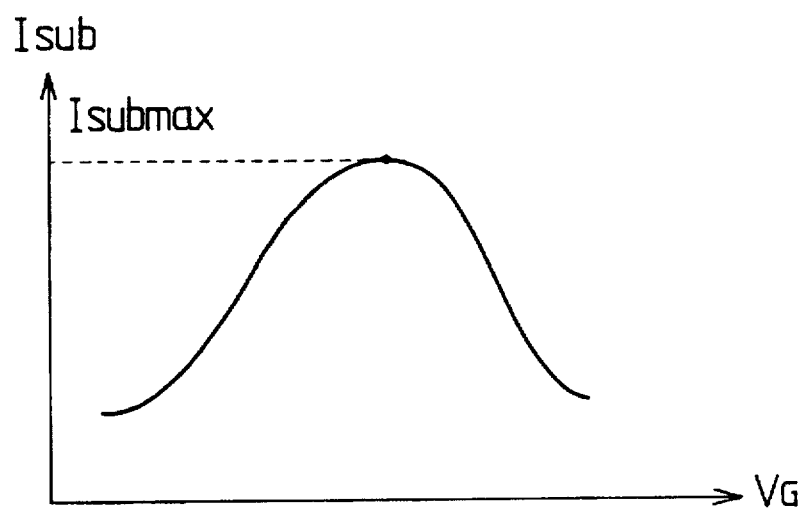
FIG. 11 is a graphic diagram illustrating the relationship between $V_G$ and $I_{sub}$ that is used to illustrate the maximum value $I_{submax}$ of substrate current.

FIG. 10 illustrates the measured deterioration period during which the characteristics of MOS transistors both in the case of this embodiment (the two-layer type plasma SiN film) and in the case of the comparative example (the single-layer plasma SiN film) deteriorate by 10%. In FIG. 10, the maximum value $I_{submax}/W$ of the drain current per an unit gate width in a MOS transistor is plotted on the abscissa axis and the time Gm 10% is plotted on the ordinate axis. Also, as samples, there are used N channel MOS transistors which are set such that W/L=25.0/1.0. Here, $I_{submax}$ represents a maximum value of a substrate current. As illustrated in FIG. 11, the maximum value $I_{submax}$ of the substrate current is a value $I_{sub}$ of the substrate current that corresponds to the maximum value of the substrate current in the relationship between a gate voltage $V_G$ and the substrate current $I_{sub}$.

It is understood from FIG. 10 that, when the operating voltage is set to 5.5 bolts, the use of the single-layer type plasma SiN film, which is a conventional product, could not satisfy the requirement of continuous 1.7-year use. However, as illustrated in FIG. 10, the use of the two-layer type plasma SiN film according to the first embodiment device can satisfy its same requirement.

As mentioned above, the present embodiment has the following two characterizing features (a) and (b).

(a) The plasma SiN film that serves as a passivation film (surface protection film) is formed into a two-layer structure. The lower side layer is made to be the low hydrogen content plasma SiN film that is lower in content of hydrogen than the upper layer plasma SiN film. As a result, it is possible to suppress that the hydrogen in the upper layer plasma SiN film enters the MOS transistor side. Accordingly, the life of the hot carriers is ensured, that is, the deterioration period of the MOS transistor is assured long enough.

(b) As the method for producing the two-layer structure plasma SiN film having the low hydrogen content plasma SiN film and the high hydrogen content plasma SiN film, the following two modes of procedure are adopted. Namely, the supply of silane family gas is performed while the flowrate thereof is being increased in a state where the ammonium gas is being supplied at a fixed flowrate. As a result, low hydrogen content plasma SiN film 24 is formed. As the other mode of procedure, the supply of ammonium gas and silane family gas is performed at a fixed flowrate. Due to the supply, high hydrogen content plasma SiN film 25 that is higher in content of hydrogen than low hydrogen content plasma SiN film 24 is formed on low hydrogen content plasma SiN film 24. Accordingly, the two-layer structure plasma SiN film that serves as the passivation film can be formed with the continuous use of the same apparatus.

Next, modifications of the first embodiment will be explained.

Figure 12:
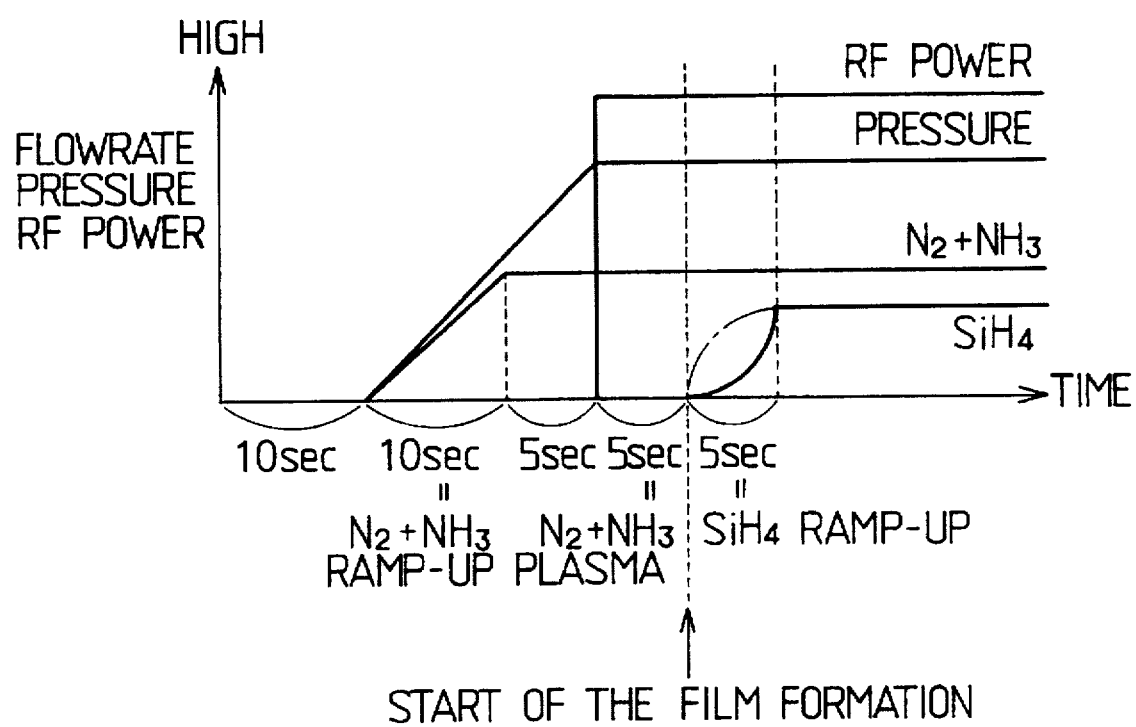
FIG. 12 is a diagram illustrating respective states of the supply of the gas, the pressure and the RF power when the plasma SiN film is made under the plasma CVD method.

In FIG. 7 the flowrate at which silane gas (SiH$_4$) is supplied is increased linearly. However, as illustrated in FIG. 12, when supplying silane gas, the flowrate thereof may be increased not linearly but curvilinearly (in FIG. 12, two examples are illustrated by a one-dot chain line and a solid line).

Figure 13:
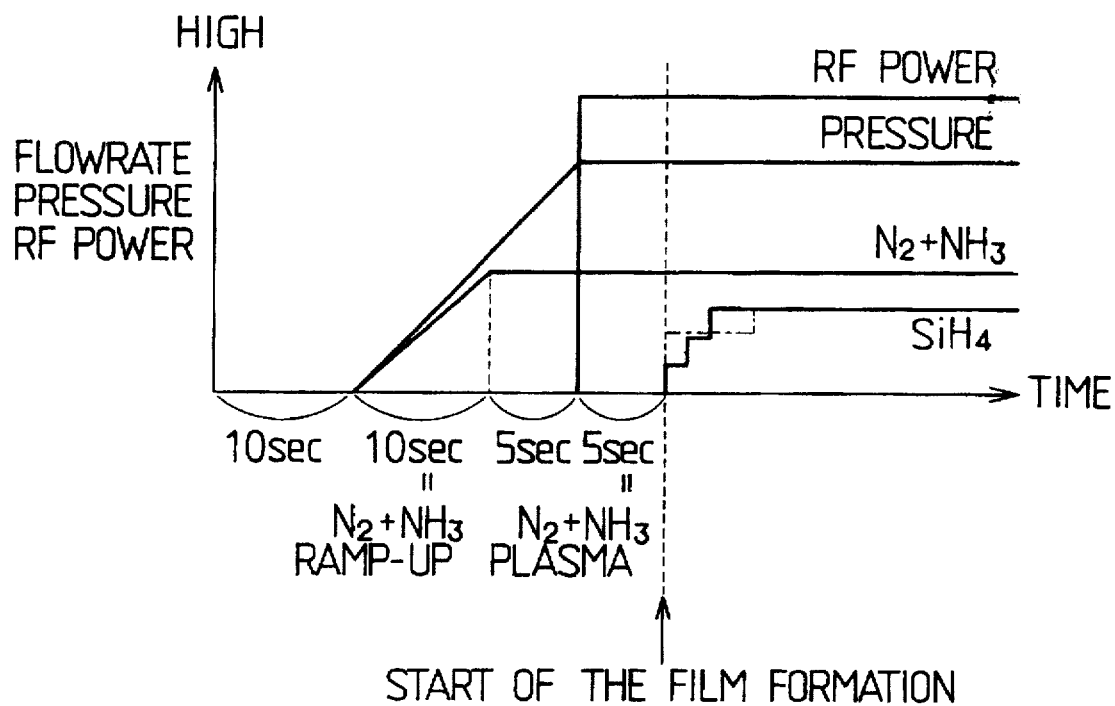
FIG. 13 is a diagram illustrating respective states of the supply of the gas, the pressure and the RF power when the plasma SiN film is made under the plasma CVD method.

Or, as illustrated in FIG. 13, when supplying silane gas, the flowrate thereof may be increased like a staircase (stepwise) (in FIG. 13, a solid line shows the three-step operation in the increase of silane gas and a one-dot chain line shows the two-step operation).

Figure 14:
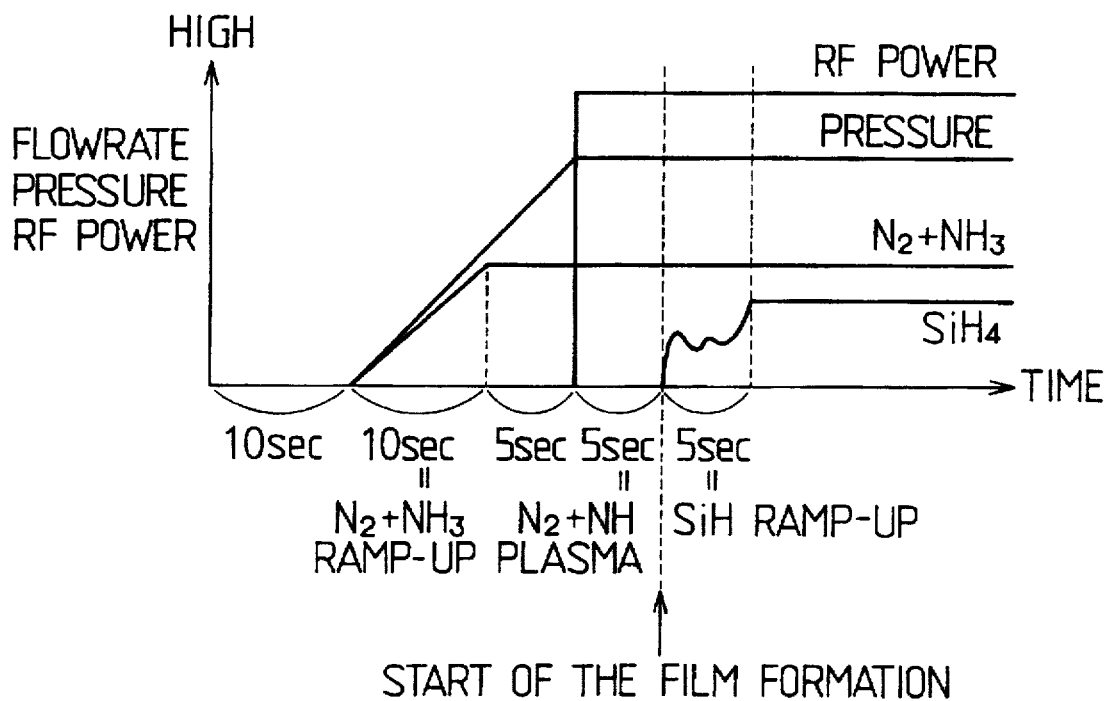
FIG. 14 is a diagram illustrating respective states of the supply of the gas, the pressure and the RF power when the plasma SiN film is made under the plasma CVD method.

Or, as illustrated in FIG. 14, when supplying silane gas, the flowrate thereof may be increased while it is being decreased for each of certain periods of time.

Figure 15:
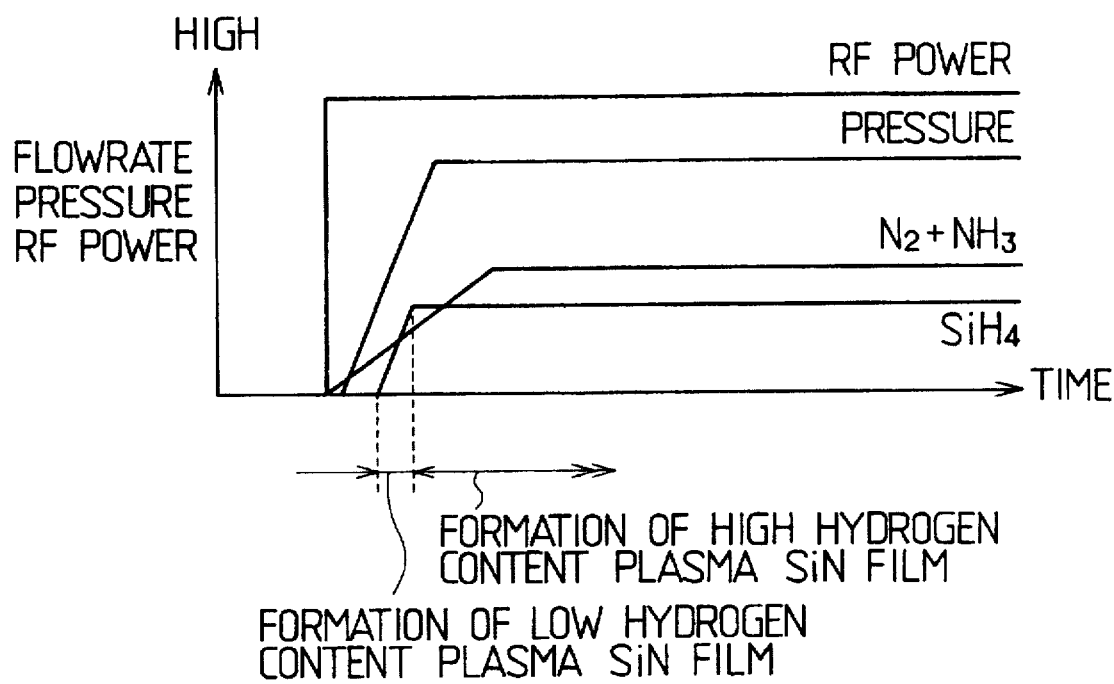
FIG. 15 is a diagram illustrating respective states of the supply of the gas, the pressure and the RF power when the plasma SiN film is made under the plasma CVD method.

Or, as illustrated in FIG. 15, after power-on of the high frequency power supply, the flowrate of silane gas may be increased during a time period in which the flowrates of nitrogen gas (N$_2$) and ammonium gas (NH$_3$) are being increased to thereby form low hydrogen content plasma SiN film 24.

(Second Embodiment)

Next, a second embodiment of the present invention will be explained with a focus being placed on the difference from the first embodiment.

Figure 16:
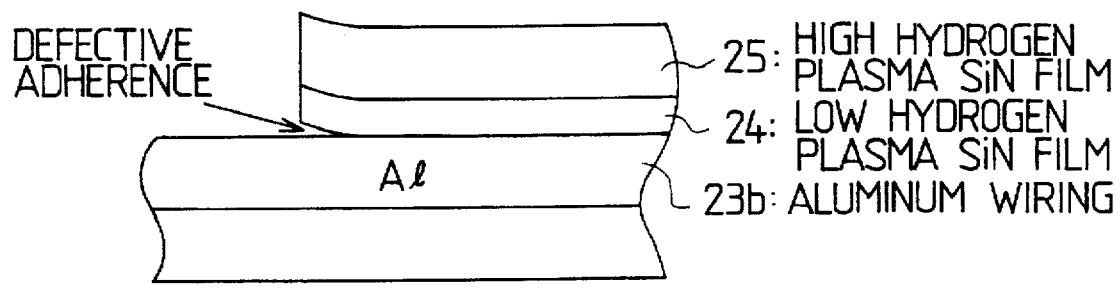
FIG. 16 is a sectional view illustrating a state of formation of the plasma SiN film.

In the manufacturing method according to the first embodiment, after the formation of low hydrogen content plasma SiN film 24 and high hydrogen content plasma SiN film 25, etching is performed with respect to plasma SiN films 24 and 25 so as to open the aluminum pad portions. However, at this time, as illustrated in FIG. 16, low hydrogen content plasma SiN film 24 over aluminum wiring 23b is likely to be raised therefrom. Since etching solution enters from this portion of defective adherence, the opening portion of a desired configuration is difficult to obtain. That is, when comparing the etch rate of a plasma SiN film containing a large amount of hydrogen with that of a plasma SiN film containing a small amount of hydrogen, the etch rate of the latter plasma SiN film is higher. Therefore, in low hydrogen content plasma SiN film 24 that is in contact with the aluminum wiring 23b functioning as the underlying layer, the etching solution speedily enters from the portion of defective adherence, with the result that side etching occurs inconveniently.

Figure 17:
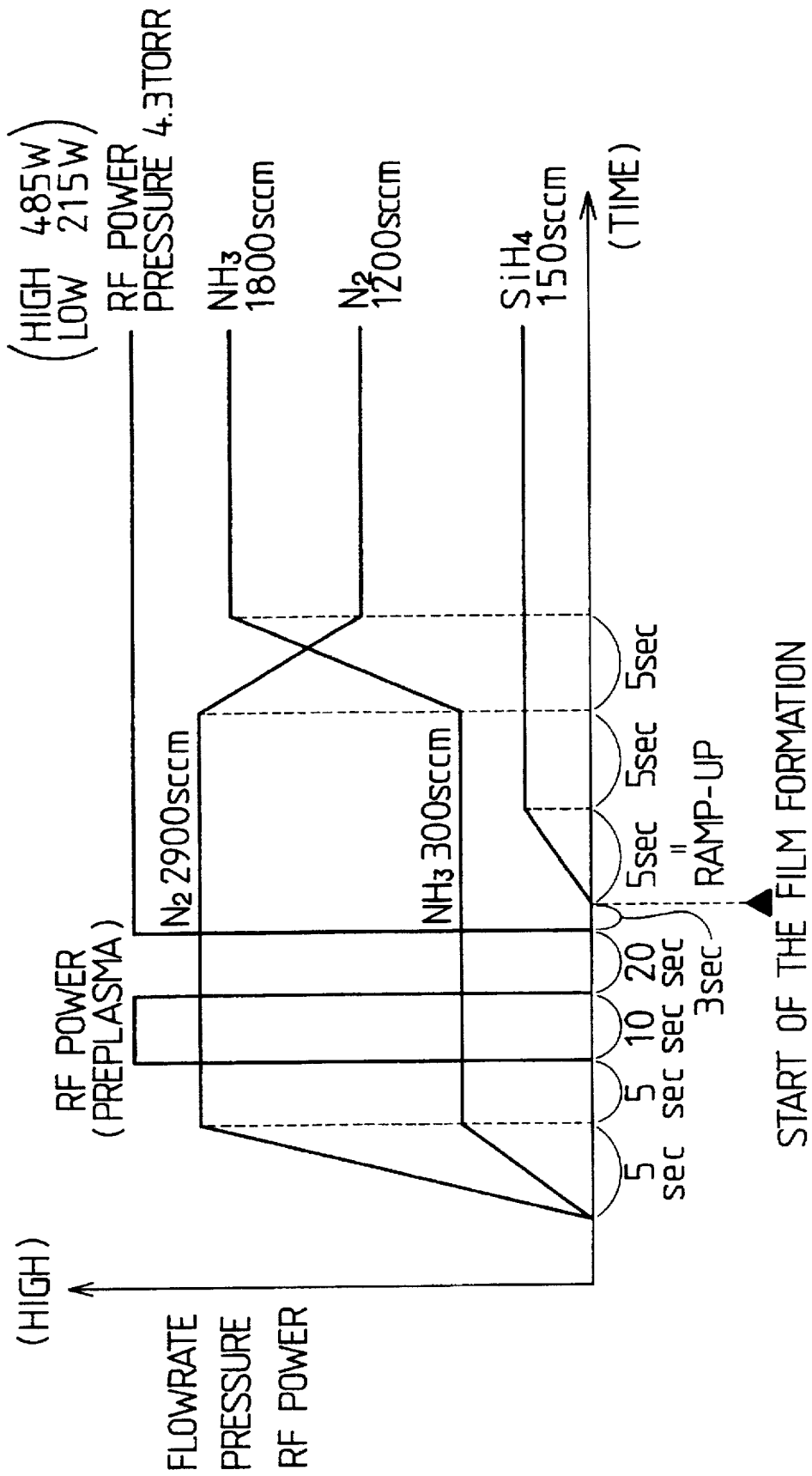
FIG. 17 is a diagram illustrating respective states of the supply of the gas, the pressure and the RF power when the plasma SiN film is made under the plasma CVD method according to a second embodiment of the present invention.

On this account, in the second embodiment, as illustrated in FIG. 17, before causing the flow of silane gas (SiH$_4$), the RF power (high frequency power source voltage) is applied in a state where nitrogen gas (N$_2$) is flowing. As a result, plasma surface roughening processing is performed with respect to the surface of aluminum wiring 23b. Thereafter the film formation of low hydrogen content plasma SiN film 24 is started.

In more detail, first, nitrogen gas (N$_2$) and ammonium gas (NH$_3$) start to be supplied simultaneously. After the lapse of 5 seconds, the flowrates thereof are set to be at predetermined values (N$_2$; 2900 sccm, NH$_3$; 300 sccm). When another 5 seconds have lapsed thereafter, the RF power is made "on" for 10 seconds. Through this preplasma processing, nitrogen gas (N$_2$) changes into plasma. As a result, the surface of aluminum wiring 23b that constitutes the underlying layer of low hydrogen content plasma SiN film 24 is tapped to have irregularities formed thereon by means of the plasma.

When 20 seconds have lapsed after the end of the preplasma processing, the RF power is applied (High 485 W and Low 215 W). When 3 seconds have lapsed from the on-operation of the RF power, the supply of silane gas (SiH$_4$) is started and the film formation is thereby started. And, by increasing the flowrate of silane gas (SiH$_4$) supplied, low hydrogen content plasma SiN film 24 is formed. After 5 seconds has elapsed from the start of the supply of silane gas, the flowrate of silane gas (SiH$_4$) is set to be at a prescribed value (150 sccm). Thereafter, further, when 5 seconds have lapsed, the flowrate of nitrogen gas (N$_2$) is decreased and the flowrate of ammonium gas (NH$_3$) is increased. After 5 seconds from the changes in the flowrates of nitrogen gas and ammonium gas, the flowrate of nitrogen gas (N$_2$) and the flowrate of ammonium gas (NH$_3$) are set to be at 1200 sccm and at 1800 sccm, respectively. In this state, high hydrogen content plasma SiN film 25 is laminated on low hydrogen content plasma SiN film 24.

Here, the reason why in FIG. 17 when forming low hydrogen content plasma SiN film 24, i.e., when silane gas ramps up (the flowrate thereof is gradually increased) the a large amount of nitrogen gas is supplied is to strengthen the bond of Si and N. That is, comparing the case of producing the SiN film from nitrogen in ammonium gas with the case of producing the SiN film from nitrogen in nitrogen gas, the bond of Si and N in the SiN film formed from nitrogen in nitrogen gas is stronger than that in the SiN film formed from nitrogen in ammonium gas. However, when the SiN film is produced from nitrogen in nitrogen gas,-this film has an increased film stress or has a deteriorated in-plane uniformity. Therefore, if the supply of silane gas has been stabilized, the flowrate of nitrogen gas is decreased and the flowrate of ammonium gas is increased to thereby obtain high hydrogen content plasma SiN film 25 that has a low film stress and an excellent in-plane uniformity.

It is to be noted here that nitrogen gas originally functions as a carrier gas under the plasma CVD method.

As mentioned above, the present embodiment has the following two characterizing features (a) and (b).

(a) Since, before causing the flow of silane family gas, the power source voltage is applied in a state where nitrogen gas is being supplied. Accordingly, a plasma surface roughening processing is performed with respect to the surface of the underlying layer. Since the film formation is started thereafter, low hydrogen content plasma SiN film 24 is formed on the underlying layer the surface of which is roughened. Therefore, low hydrogen content plasma SiN film 24 can be firmly adhered onto this underlying layer. That is, the surface of the Al (aluminum) layer functioning as the underlaying layer is tapped by the plasma and is thereby brought to a state of irregularities. As a result, the adherence between the plasma SiN film 24 containing a less amount of hydrogen and aluminum wiring 23b is enhanced.

Also, through the execution of the preplasma processing, the temperature of the substrate rises. As a result, the substrate temperature becomes approximate to the temperature of low hydrogen content plasma SiN film 24 that prevails when plasma SiN film 24 is being formed, whereby the adherence is enhanced.

(b) Since, when forming low hydrogen content plasma SiN film 24, a large amount of nitrogen gas supplied to form the plasma SiN film 24 mainly from nitrogen in nitrogen gas. Therefore, it is possible to strengthen the bond between Si and H in the low hydrogen content plasma SiN film 24. After the formation of low hydrogen content plasma SiN film 24, the flowrate of nitrogen gas is decreased and the flowrate of ammonium gas is increased. Thus, it is possible to achieve the decrease in the film stress and the increase in the in-plane uniformity with respect to high hydrogen content plasma SiN film 25.

Incidentally, in FIG. 17 after the preplasma processing the RF power is made "off" once. However, this making-"off" is not always necessary. Further, if the RF power is kept "on" for a long period of time, the irregularities of the underlying layer (aluminum wiring) become too large. For this reason, it is preferable to set the time period for the preplasma processing so as not to exceed a predetermined length of time.

Next, modifications of the second embodiment will be explained.

Figure 18:
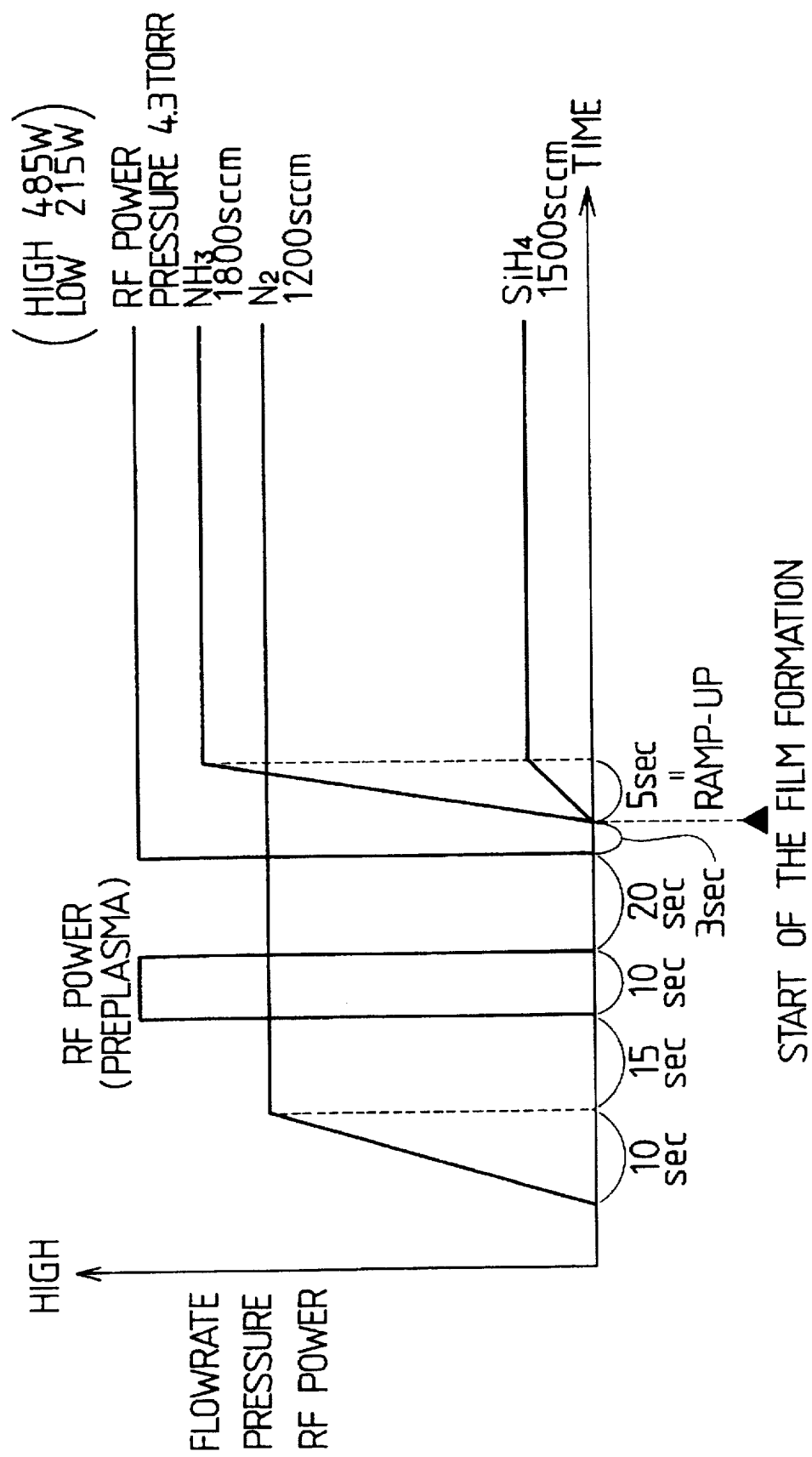
FIG. 18 is a diagram illustrating respective states of the supply of the gas, the pressure and the RF power when the plasma SiN film is made under the plasma CVD method.

As illustrated in FIG. 18, after the preplasma processing is performed while nitrogen gas ($N_2$) is being supplied, ammonium gas ($NH_3$) may be started to be supplied.

It is to be noted that although in each of the first and second embodiments as illustrated in, for example, FIGS. 7 and 17 the amounts (flowrates) of gases to be supplied are defined, it is also possible to define the concentrations of gases within a chamber of the CVD apparatus. That is, since the concentration of gas becomes low when the flowrate thereof is low and becomes high when the flowrate thereof is high, the semiconductor device may be manufactured while adjusting the concentration of gas so that the condentration of gas within the chamber may become a predetermined value.

(Third Embodiment)

Next, a third embodiment of the present invention will be explained with a focus being placed on the difference from the first embodiment.

In the first embodiment the two-layer structure has been applied to the plasma SiN film serving as the passivation film. In the third embodiment the two-layer structure plasma SiN film is applied to each of a passivation film and an interlayer insulation film. That is, the two-layer structure plasma SiN film is also applied to plasma SiN film 19 in the IC illustrated in FIG. 1. The third embodiment will now be explained with reference to FIG. 19 which is an enlarged view of the region of FIG. 1 where N channel MOS transistor Tr3 is formed.

According to the third embodiment, a high hydrogen content plasma SiN film 31 is laminated on a low hydrogen content plasma SiN film 30. The total thickness of low hydrogen content plasma SiN film 30 and high hydrogen content plasma SiN film 31 is about 1000 Å. The thickness of low hydrogen content plasma SiN film 30 is about 160 Å. The remaining portions are the same as those shown in the first embodiment and a detailed explanation thereof is omitted with these portions being denoted by the same reference numerals.

The hydrogen that is contained in TEOS films 20 and 22 or SOG film 21 becomes a cause of the hot carrier deterioration in the MOS transistor formed in P-type silicon substrate 1. The hydrogen contained in high hydrogen content plasma SiN film 31 also becomes a cause of the hot carrier deterioration in the MOS transistor. Low hydrogen content plasma SiN film 30 inhibits the passage of the hydrogen therethrough. As a result, although hydrogen is about to enter from inside the films 20, 22 and 31 into the MOS transistor side, the entry of the hydrogen is blocked (the hydrogen is trapped) by low hydrogen content plasma SiN film 30 having the reduced amount of Si-H bonds.

By applying the two-layer structure to the plasma SiN film 19 serving as the interlayer insulation film as mentioned above, excellency is obtained in protecting the performance of the MOS transistor. Further, as stated also in connection with the first embodiment, the production of the plasma SiN film having the two-layer structure is easy.

(Fourth Embodiment)

Next, a fourth embodiment of the present invention will be explained with a focus being placed on the difference from the third embodiment.

In the third embodiment plasma SiN film 19 is used as the interlayer insulation film that is disposed between first layer aluminum wiring 18a, 18b and 18c and second layer aluminum wiring 23a and 23b. That is, the two-layer structure is applied to the plasma SiN film 19 disposed between the multi-layer wiring. In the fourth embodiment the plasma SiN film is used as an insulation film disposed between a MOS transistor and wiring disposed on the MOS transistor. That is, the fourth embodiment uses the plasma SiN film in substitution for BPSG film 17 in the IC illustrated in FIG. 1.

Figure 19:
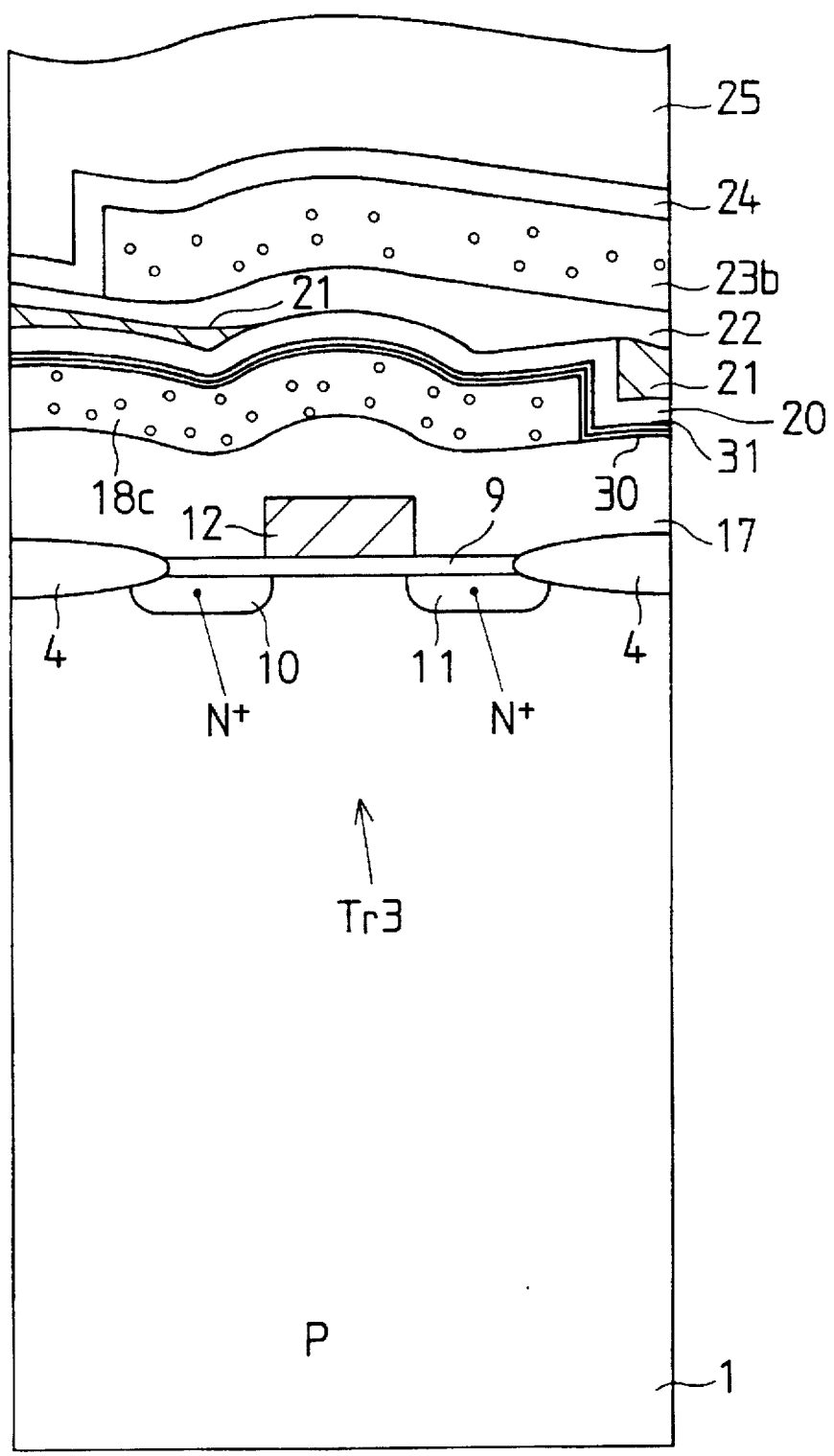
FIG. 19 is a sectional view illustrating a main portion of a semiconductor device according to a third embodiment of the present invention.
Figure 20:
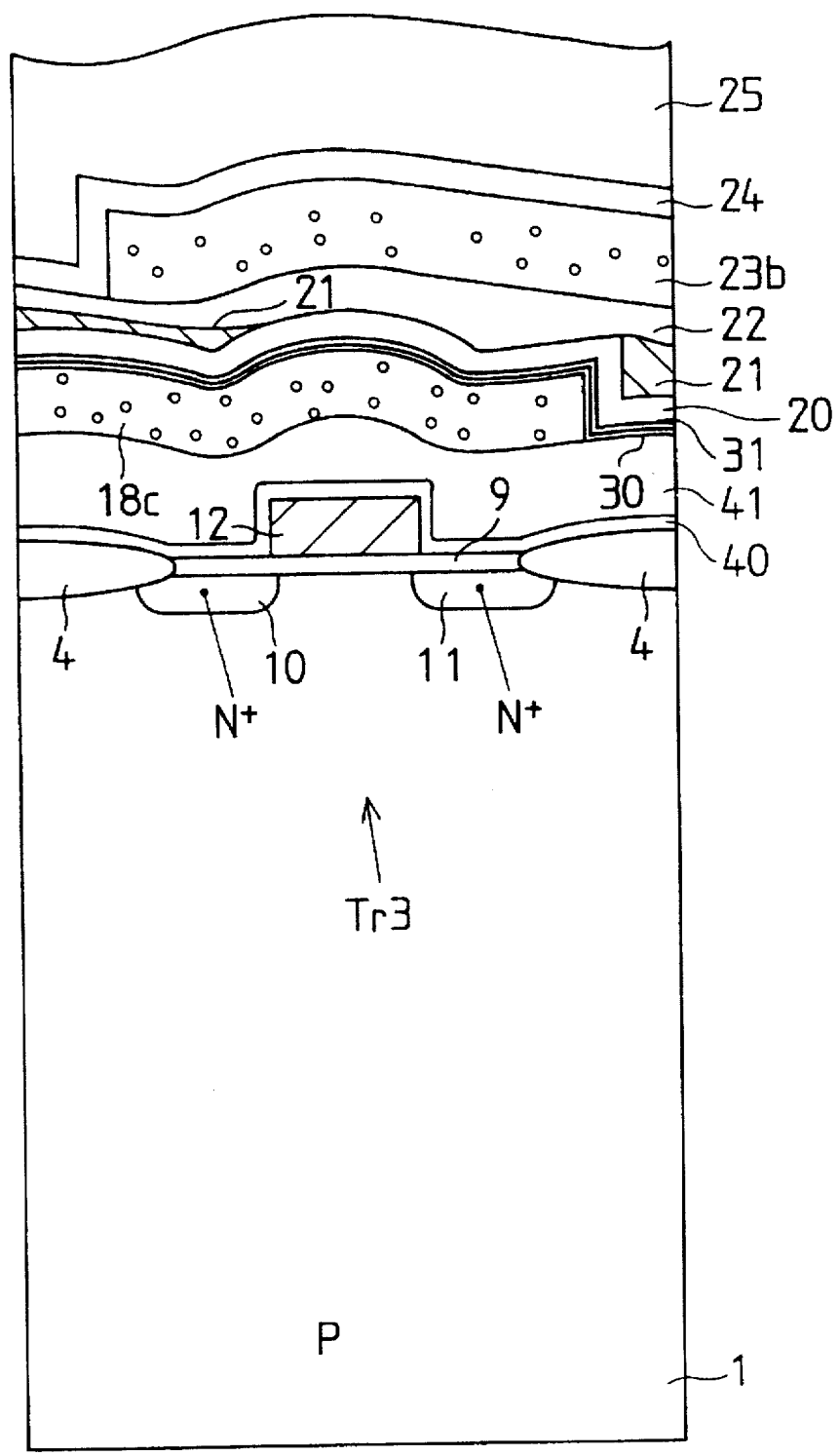
FIG. 20 is a sectional view illustrating a main portion of a semiconductor device according to a fourth embodiment of the present invention.

The fourth embodiment will now be explained with reference to FIG. 20 (which is an enlarged view of the region of FIG. 1 where N channel MOS transistor Tr3 is formed) corresponding to FIG. 19.

A low hydrogen content plasma SiN film 40 is formed over gate electrode 21 of N channel MOS transistor Tr3.

Over low hydrogen content plasma SiN film 40 there is laminated a high hydrogen content plasma SiN film 41. Over these plasma SiN films 40 and 41 there are formed aluminum wiring 18a, 18b and 18c. The remaining portions are the same as those shown in the third embodiment and a detailed explanation thereof is omitted with these portions being denoted by the same reference numerals.

In this embodiment also, hydrogen contained in high hydrogen content plasma SiN film 41 becomes a cause of the hot carrier deterioration in the MOS transistor formed in P-type silicon substrate. Low hydrogen content plasma SiN film 40 inhibits the passage of the hydrogen therethrough. As a result, although hydrogen is about to enter from inside high hydrogen content plasma SiN film 41 into the MOS transistor, the entry of this hydrogen is blocked (the hydrogen is trapped) by low hydrogen content plasma SiN film 40 having the reduced amount of Si-H bonds.

The present invention is not limited to each of the above-mentioned embodiments. That is, the present invention may be applied to only the plasma SiN film which serves as the interlayer insulation film, or may be applied to only the plasma SiN film which serves as the insulation film that covers the gate electrode of the MOS transistor. That is, the present invention may be applied to only the interlayer insulation film or to only the insulation film which is disposed between the MOS transistor and the wiring disposed thereover, without applying the invention to the passivation film which is the surface protection film.

Also, the present invention can be applied to the semiconductor device such as an IGBT and an LDMOS as well.

Further, the present invention is not limited to the IC to be used in an automobile and can be applied to the ICs for other uses.

What is claimed is:

1. A method for manufacturing a semiconductor device, in which a transistor having a gate insulation film is formed in a semiconductor substrate of which surface is covered with a plasma SiN film formed by a plasma CVD method directed to forming a SiN film on said semiconductor substrate while supplying ammonium gas and silane family gas, the method comprising the steps of:

forming a low hydrogen content plasma SiN film by supplying the ammonium gas and the silane family gas while increasing at least one of an ammonium gas amount and a silane family gas amount; and laminating on said low hydrogen content plasma SiN film a plasma SiN film that is higher in content of hydrogen than said low hydrogen content plasma SiN film by supplying the ammonium gas and the silane family gas at a fixed flowrate.

2. A method for manufacturing a semiconductor device as set forth in claim 1, wherein said step of forming said low hydrogen content plasma SiN film is performed under a reduced pressure in a state where electric discharge is possible.

3. A method for manufacturing a semiconductor device as set forth in claim 1, wherein said step of forming said low hydrogen content plasma SiN film is performed in a state where the ammonium gas is being supplied at the fixed flowrate and the silane family gas is supplied while a flowrate thereof is being increased.

4. A method for manufacturing a semiconductor device as set forth in claim 1, wherein said step of forming said low hydrogen content plasma SiN film is performed such that the ammonium gas and the silane gas are supplied while a flowrate of at least one of the ammonium gas and the silane gas is being increased linearly.

5. A method for manufacturing a semiconductor device as set forth in claim 1, wherein said step of forming said low hydrogen content plasma SiN film is performed such that the ammonium gas and the silane gas are supplied while a flowrate of the silane gas is being increased stepwise.

6. A method for manufacturing a semiconductor device as set forth in claim 1, wherein said step of forming said low hydrogen content plasma SiN film controls flowrate of the ammonium gas and the silane gas so that said low hydrogen content plasma SiN film has a amount of Si-H bonds of $6 \times 10^{21}/cm^3$ or less.

7. A method for manufacturing a semiconductor device as set forth in claim 1, wherein said step of forming said low hydrogen content plasma SiN film supplies larger amount of nitrogen gas than that supplied by said step for laminating.

8. A method for manufacturing a semiconductor device as set forth in claim 7, wherein said step of forming said low hydrogen content plasma SiN film supplies smaller amount of the ammonium gas than that supplied by said step for laminating.

9. A method for manufacturing a semiconductor device as set forth in claim 1, further comprising the step of:

applying a power source voltage in a state where nitrogen gas is being supplied before causing the silane family gas to flow by said step for forming, in order to execute surface toughening processing by means of plasma of nitrogen on a surface of an underlying layer on which said low hydrogen content plasma SiN film is formed.

10. A method for manufacturing a semiconductor device as set forth in claim 9, wherein said step of forming said low hydrogen content plasma SiN film supplies larger amount of the nitrogen gas than that supplied by said step for laminating.

11. A method for manufacturing a semiconductor device as set forth in claim 10, wherein said step of forming said low hydrogen content plasma SiN film supplies smaller amount of the ammonium gas than that supplied by said step for laminating.

* * * * *